US011482585B2

(12) United States Patent
Han

(10) Patent No.: US 11,482,585 B2
(45) Date of Patent: Oct. 25, 2022

(54) DISPLAY PANEL AND DISPLAY DEVICE WITH METAL LAYER OF STACKED POWER LINE EXTENDING BEYOND ENCAPSULATION

(71) Applicant: BOE Technology Group Co., Ltd., Beijing (CN)

(72) Inventor: Long Han, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 245 days.

(21) Appl. No.: 16/767,175

(22) PCT Filed: Dec. 17, 2019

(86) PCT No.: PCT/CN2019/126101
§ 371 (c)(1),
(2) Date: May 27, 2020

(87) PCT Pub. No.: WO2020/140747
PCT Pub. Date: Jul. 9, 2020

(65) Prior Publication Data
US 2021/0225986 A1    Jul. 22, 2021

(30) Foreign Application Priority Data
Jan. 2, 2019 (CN) .......................... 201910002875.8

(51) Int. Cl.
*H01L 27/32* (2006.01)
*H01L 51/52* (2006.01)
(52) U.S. Cl.
CPC ...... *H01L 27/3276* (2013.01); *H01L 27/3246* (2013.01); *H01L 51/5253* (2013.01)

(58) Field of Classification Search
CPC ............. H01L 27/3276; H01L 27/3246; H01L 51/5253
See application file for complete search history.

(56) References Cited

U.S. PATENT DOCUMENTS

2013/0292652 A1    11/2013  Son
2016/0079324 A1     3/2016  Go et al.
(Continued)

FOREIGN PATENT DOCUMENTS

CN    106847867 A    6/2017
CN    108292488 A    7/2018
(Continued)

OTHER PUBLICATIONS

Chinese Office Action dated May 28, 2020 in related Chinese Application No. 201910002875.8.

*Primary Examiner* — Lex H Malsawma
(74) *Attorney, Agent, or Firm* — ArentFox Schiff LLP; Michael Fainberg

(57) ABSTRACT

The present application discloses a display panel and a display device. The display panel includes: a base substrate; a reference power line, arranged in a non-display area and including a first electrode metal layer and a second electrode metal layer which are arranged on the base substrate in sequence in a stacked manner; and an encapsulating structure, arranged on a side, deviating from the base substrate, of the reference power line; where in the reference power line, a projection of the second electrode metal layer on the base substrate is arranged within a projection of the encapsulating structure on the base substrate, and a projection of the first electrode metal layer on the base substrate goes beyond an edge of the projection of the encapsulating structure on the base substrate.

18 Claims, 3 Drawing Sheets

(56) References Cited

U.S. PATENT DOCUMENTS

| | | | | |
|---|---|---|---|---|
| 2018/0061899 A1* | 3/2018 | Oh | ...................... | H01L 51/5246 |
| 2018/0151834 A1* | 5/2018 | Kanaya | ................. | H01L 51/504 |
| 2018/0159074 A1* | 6/2018 | Kim | .................... | H01L 27/3248 |
| 2018/0204895 A1 | 7/2018 | Lin et al. | | |
| 2018/0205037 A1* | 7/2018 | Kim | .................... | H01L 27/3276 |
| 2018/0366520 A1* | 12/2018 | Gwon | ................. | H01L 51/5206 |
| 2019/0004654 A1* | 1/2019 | Gwon | ................. | H01L 27/3244 |
| 2020/0212114 A1* | 7/2020 | Song | ..................... | H01L 27/323 |

FOREIGN PATENT DOCUMENTS

| | | |
|---|---|---|
| CN | 108878480 A | 11/2018 |
| CN | 208127214 U | 11/2018 |
| CN | 109742103 A | 5/2019 |

\* cited by examiner

DISPLAY PANEL AND DISPLAY DEVICE WITH METAL LAYER OF STACKED POWER LINE EXTENDING BEYOND ENCAPSULATION

CROSS REFERENCE TO RELATED APPLICATIONS

The present application is a National Stage of International Application No. PCT/CN2019/126101, filed Dec. 17, 2019, which claims the priority to Chinese Patent Application No. 201910002875.8, filed with the Chinese Patent Office on Jan. 2, 2019 and entitled "Display Panel and Display Device", which is hereby incorporated by reference in its entirety.

FIELD

The present application relates to the field of display technology, in particular to a display panel and a display device.

BACKGROUND

Compared with a liquid crystal display panel, an organic electroluminescent display panel has the advantages of self-illumination, low energy consumption, low production cost, wide viewing angle, high contrast, fast response speed, more realistic color display, and easy realization of light-weight and flexibility, therefore, the organic electroluminescent display panel is starting to become a mainstream selection of the next generation display panel.

However, in the existing organic electroluminescent display panel, a drain or source signal line is a layer of metal layer structure, and is overlapped with a cathode through an anode layer (an ITO film). After an organic electroluminescent display panel is encapsulated with a thin-film encapsulation (TFE) structure, water vapor permeated from the outside may enter a display area of the organic electroluminescent display panel along the above anode layer to cause undesirable black spots, thereby leading to performance degradation of the organic electroluminescent display panel.

SUMMARY

Embodiments of the present application provide a display panel and a display device, thereby avoiding water vapor permeating to the encapsulated thin film from the outside from entering a display area of the display panel, and further improving the performance of the display panel to the greatest extent.

Embodiments of the present application provide a display panel, including: a base substrate; a reference power line, arranged in a non-display area and including a first electrode metal layer and a second electrode metal layer which are arranged on the base substrate in sequence in a stacked manner; and an encapsulating structure, arranged on a side, deviating from the base substrate, of the reference power line; where in the reference power line, a projection of the second electrode metal layer on the base substrate is arranged within a projection of the encapsulating structure on the base substrate, and a projection of the first electrode metal layer on the base substrate goes beyond an edge of the projection of the encapsulating structure on the base substrate.

In one possible implementation, the display panel further includes: an inorganic insulating layer arranged between the first electrode metal layer and the second electrode metal layer, where the inorganic insulating layer completely covers the part of the first electrode metal layer going beyond the edge of the encapsulating structure.

In one possible implementation, the material of the inorganic insulating layer includes silicon oxide or silicon nitride.

In one possible implementation, the display panel further includes: a blocking dam arranged between the second electrode metal layer and the encapsulating structure, where the blocking dam covers on a side, close to the edge of the encapsulating structure, of the second electrode metal layer.

In one possible implementation, the display panel further includes: a pixel definition layer arranged between the second electrode metal layer and the encapsulating structure; where the pixel definition layer and the blocking dam belong to the same film layer.

In one possible implementation, the display panel further includes: an organic insulating layer arranged between the pixel definition layer and the second electrode metal layer.

In one possible implementation, on a side, close to the edge of the encapsulating structure, of the second electrode metal layer, the organic insulating layer completely covers the second electrode metal layer.

In one possible implementation, on a side, close to the edge of the encapsulating structure, of the second electrode metal layer, the blocking dam completely covers the organic insulating layer.

In one possible implementation, the display panel further includes a cathode layer arranged on a side, far away from the second electrode metal layer, of the pixel definition layer; part of the first electrode metal layer goes beyond the edge of the encapsulating structure, and at the position at which the first electrode metal layer does not go beyond the edge of the encapsulating structure, the cathode layer is electrically connected with the second electrode metal layer.

In one possible implementation, the first electrode metal layer and the second electrode metal layer are titanium/aluminum/titanium metal composite film layers.

In addition, embodiments of the present application further provide a display device, where the display device includes a display panel mentioned in any of the above items.

DETAILED DESCRIPTION OF THE EMBODIMENTS

Figure 1:
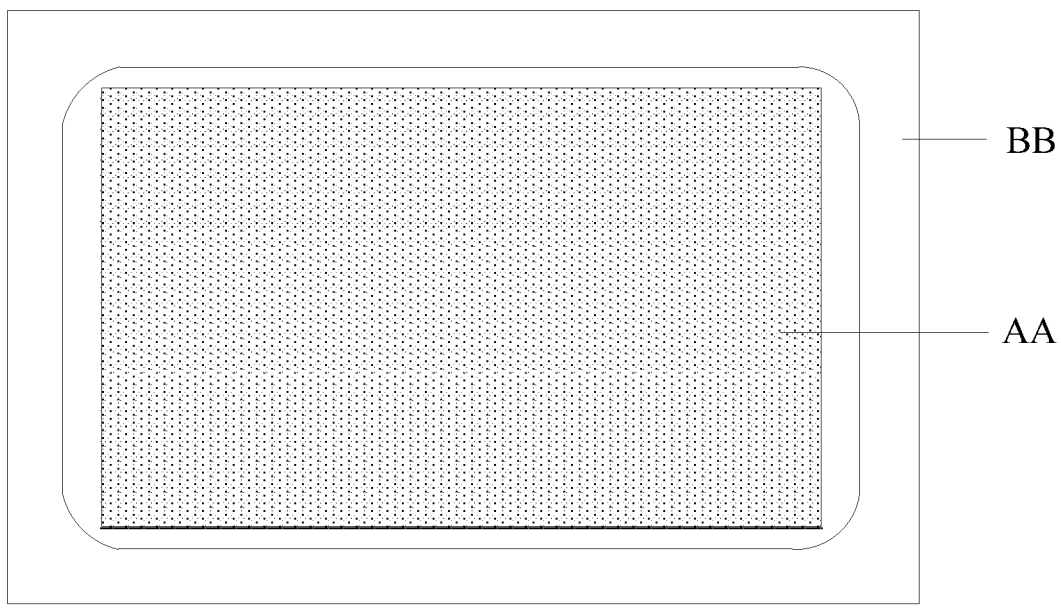
FIG. 1 is a structural schematic diagram of a display panel provided in an embodiment of the present application.
Figure 2:
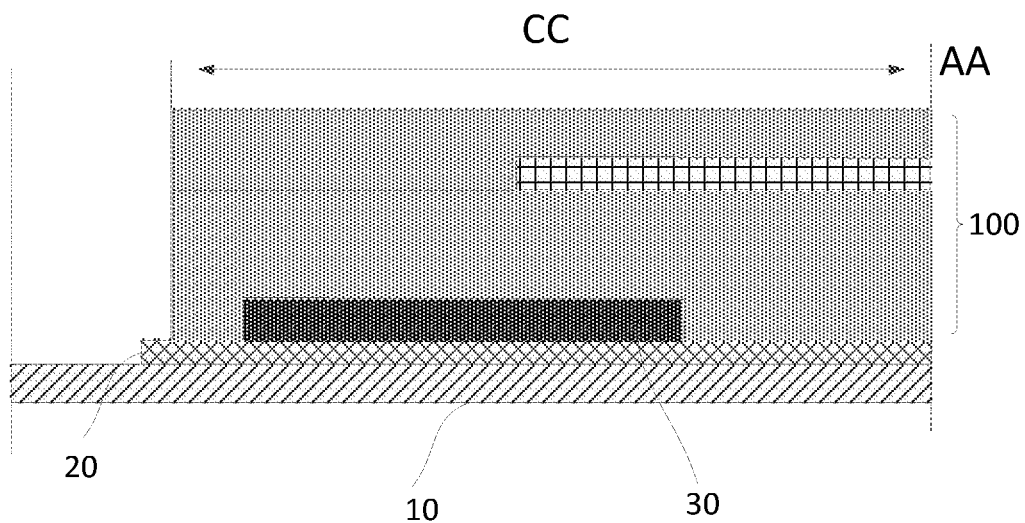
FIG. 2 is a sectional structural schematic diagram of a display panel provided in an embodiment of the present application.

In order to make the objects, technical solutions, and advantages of the present application more apparent, a clear and complete description of the technical solutions in the embodiments of the present application will be given below in combination with drawings in the embodiments of the present application.

In view of the phenomena in the related art that when an organic electroluminescent display panel is subjected to thin-film encapsulation, a drain or source signal line is a layer of metal layer structure, and is overlapped with a cathode through an anode layer (an ITO film), therefore, water vapor permeating from the outside may enter a display area of the organic electroluminescent display panel along an anode layer to cause undesirable black spots, embodiments of the present application provide a display panel and a display device, thereby avoiding water vapor permeating from the outside from entering a display area of the display panel, and further improving the performance of the display panel to the greatest extent.

Specific implementations of the display panel and the display device provided in embodiments of the present application will be described in detail below in combination with accompanying drawings.

The thickness and shape of each film layer in the drawings do not reflect true proportions, merely aiming at schematically illustrating the content of the present application.

As shown in FIG. 1, a display panel provided in an embodiment of the present application includes a display area AA and a border area BB which encircles the display area AA, where the border area BB is internally provided with an encapsulating structure. It can be understood that, the display area AA of the display panel can include at least one pixel unit, such that the display panel can not only be applied to the traditional display field, but also can be applied to the technical field of micro display; moreover, the display panel can be any product or part with a display function, such as a mobile phone, a tablet personal computer, a television, a display, a notebook computer, a digital camera, a navigator, a smart watch, a fitness wristband, a personal digital assistant, and a self-service CRS. Other essential components of the display panel should all be understood as being provided by those skilled in the art, will not be repeated redundantly herein, and should not be deemed as a limitation to the present application. As to the implementation of the display panel, please refer to the embodiments of the following encapsulating structure.

Specifically, FIG. 2 and FIG. 4 to FIG. 6 give cross sectional structural schematic diagrams of a display panel provided in embodiments of the present application. As shown in FIG. 2 and FIG. 4 to FIG. 6, the display panel includes a base substrate 10, a reference power line and an encapsulating structure 100; where the reference power line is arranged in a non-display area and includes a first electrode metal layer 20 and a second electrode metal layer 30 which are arranged on the base substrate 10 in sequence in a stacked manner; an encapsulating structure 100 is arranged on a side, deviating from the base substrate 10, of the reference power line; where in the reference power line, a projection of the second electrode metal layer 30 on the base substrate 10 is arranged within a projection of the encapsulating structure 100 on the base substrate 10, that is, the second electrode metal layer 30 is arranged on a non-display area CC on the inner side of the encapsulating structure 100, and a projection of the first electrode metal layer 20 on the base substrate 10 goes beyond an edge of the projection of the encapsulating structure 100 on the base substrate 10, that is, the first electrode metal layer 20 extends to the outer side of the encapsulating structure 100. The encapsulating structure 100 can be a TFE encapsulating structure and includes an inorganic film layer, an organic film layer and another inorganic film layer which are stacked in sequence, and will not be repeated redundantly herein. An interlayer dielectric (ILD) can be arranged on the base substrate 10.

Figure 3:
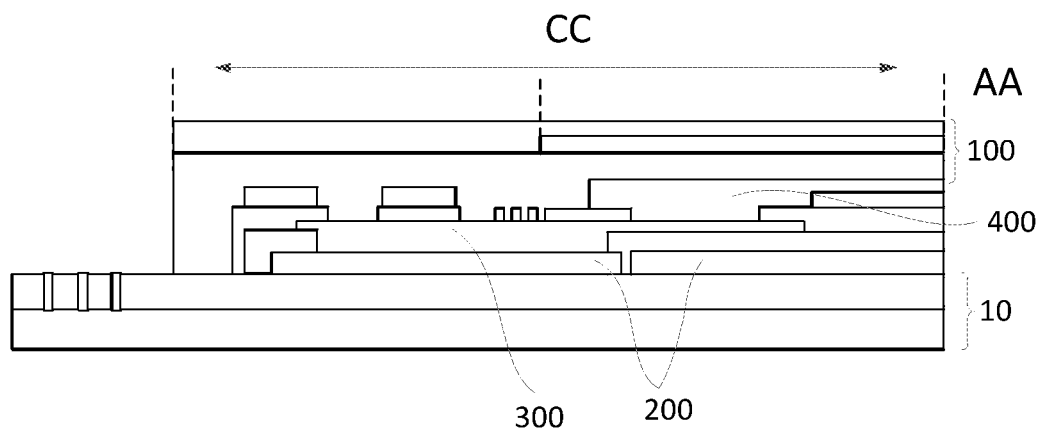
FIG. 3 is a sectional structural schematic diagram of a display panel in the related art.
Figure 4:
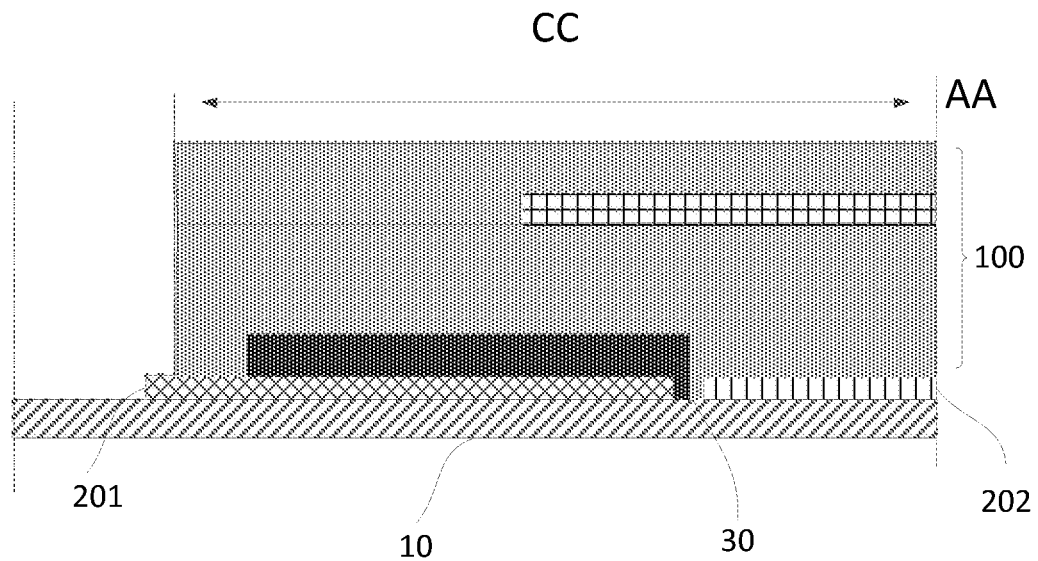
FIG. 4 is a sectional structural schematic diagram of a display panel provided in another embodiment of the present application.

Specifically, as shown in FIG. 3, in the related art, the reference power line is only a layer of metal layer 200, and the metal layer 200 is overlapped with a cathode 400 through an ITO film 300 arranged above, such that water vapor permeating from the outside may enter a display area of the display panel along the ITO film 300. In the display panel provided in an embodiment of the present application, the reference power line adopts an upper and a lower layer of metal, since the compactness of the second electrode metal layer 30 on the upper layer is higher than the compactness of the ITO film, therefore, compared with the device in the related art, the reference power line in the embodiment of the present application can block the water vapor permeating from the outside from entering the display area of the display panel as much as possible, thereby improving the performance of the display panel.

Moreover, the reference power line in the embodiment of the present application includes a first electrode metal layer 20 and a second electrode metal layer 30 which are arranged in a stacked manner. Compared with the related art (as shown in FIG. 3) in which the reference power line is merely a layer of metal layer 200, the thickness of the reference power line in the embodiment of the present application is increased, thereby reducing the current which passes by, and preventing the display panel from overheating as much as possible.

In addition, in the related art, in view that the actual encapsulating boundary position of the encapsulating structure (TFE) will go beyond the designed theoretical boundary position, laser cutting will possibly act on an inorganic encapsulating layer, thereby leading to cracks on the encapsulating layer, and enabling water vapor and oxygen to permeate through cracks and gradually enter a display area to cause undesirable black spots. To prevent cracks of an inorganic encapsulating layer caused by laser cutting and guarantee the encapsulating effect, a larger boundary needs to be reserved generally to ensure a safe distance, such that the reference power line in the related art is far away from the boundary, then the reference power line, that is, the metal layer 200, is narrow (as shown in FIG. 3), then the current passing through the reference power line is great, and the display panel is easily hot. While in an embodiment of the present application, the first electrode metal layer 20 extends to the outer side of the encapsulating structure 100, in this way, the width of the reference power line is also increased, thereby reducing the current which passes by, and further preventing the display panel from overheating.

It should be noted that, the above base substrate 10 provided in an embodiment of the present application can be a rigid base substrate such as glass, and can also be a flexible base substrate such as polyimide, which is not defined herein.

During specific implementation of the above display panel provided in an embodiment of the present application, the first electrode metal layer 20 and the second electrode metal layer 30 can both be titanium/aluminum/titanium metal composite film layers, in this way, the manufacturing processes of the first electrode metal layer 20 and the second electrode metal layer 30 can be reused to save the manufacturing process. In one possible implementation, please refer to FIG. 4, the first electrode metal layer 20 and the second electrode metal layer 30 can realize the same function signal, for example, the first electrode metal layer 20 and the second electrode metal layer 30 can both be used as a VSS electrode. Or, the second electrode metal layer 30 is used as a VSS electrode, while the first electrode metal layer 20 can include a first part 201 and a second part 202, while the first part 201 and the second part 202 can be respectively configured to realize different function signals, for example, the first part 201 can be used as a VSS electrode, while the second part 202 can be used as a VDD electrode. It should be noted that, during practical applications, the first part 201 and the second part 202 can be used as the same signal, and can also be used as different signals, where, FIG. 4 takes the first electrode metal layer 20 including two parts and the two parts being respectively used as different signals as an example.

Figure 5:
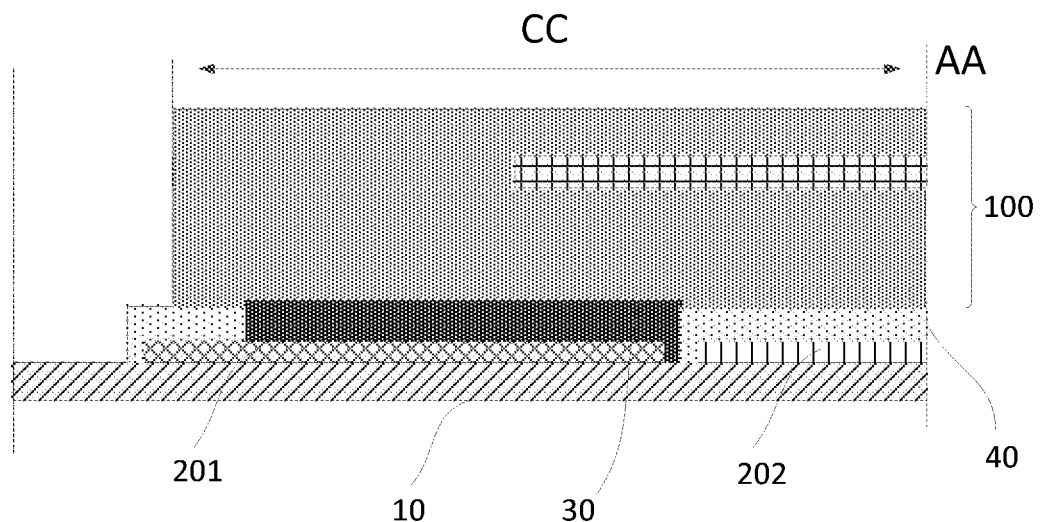
FIG. 5 is a sectional structural schematic diagram of a display panel provided in another embodiment of the present application.

Please refer to FIG. 5, during specific implementation of the above display panel provided in an embodiment of the present application, the display panel can further include an inorganic insulating layer 40 arranged between the first electrode metal layer 20 and a second electrode metal layer 30. The inorganic insulating layer 40 can be a passivation layer (PVX), and the materials can include SiOx or SiNx, etc. If the first electrode metal layer 20 includes two parts (201, 202) and the two parts (201, 202) are used as different signals, then the inorganic insulating layer 40 can isolate the first part 201 from the second part 202, which is taken as an example in FIG. 5. Specifically, the inorganic insulating layer 40 is formed with an opening, and the second electrode metal layer 30 is in contact with the first electrode metal layer 20 at the opening in a stacked manner. In an embodiment of the present application, the inorganic insulating layer 40 completely covers the part of the first electrode metal layer 20 going beyond the edge of the encapsulating structure 100, that is, the part, extending towards an outer side of the encapsulating structure 100, of the first electrode metal layer 20, is covered by the inorganic layer, so as to protect the first electrode metal layer 20 to prevent intrusion of external water vapor.

Figure 6:
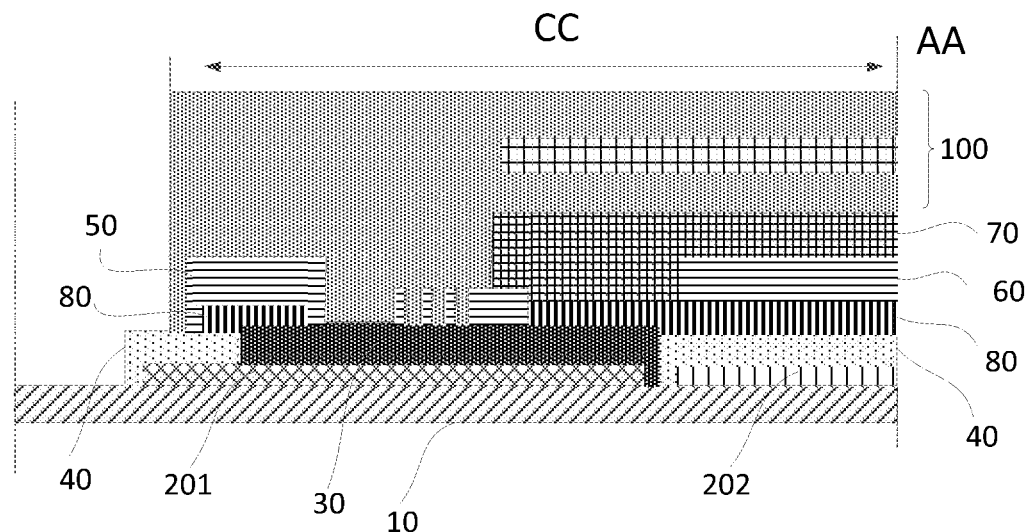
FIG. 6 is a sectional structural schematic diagram of a display panel provided in another embodiment of the present application.

Please refer to FIG. 6, during specific implementation of the above display panel provided in an embodiment of the present application, the display panel can further include a blocking dam 50 arranged between the second electrode metal layer 30 and the encapsulating structure 100, and the blocking dam 50 covers on a side, close to the edge of the encapsulating structure 100, of the second electrode metal layer 30, to protect the second electrode metal layer 30.

Please refer to FIG. 6, in one possible implementation, the display panel can further include a pixel definition layer 60 arranged between the second electrode metal layer 30 and the encapsulating structure 100, and a cathode layer 70 arranged on a side, far away from the second electrode metal layer 30, of the pixel definition layer 60, where the cathode layer 70 is electrically connected with the second electrode metal layer 30.

Specifically, the pixel definition layer 60 and the blocking dam 50 can belong to the same film layer (which is taken as an example in FIG. 6), in this way, the manufacturing process can be saved during manufacturing.

Please refer to FIG. 6, in one possible implementation, the reference power line is arranged around a display area, that is, the first electrode metal layer 20 and the second electrode metal layer 30 are arranged around the display area, where part of the first electrode metal layer 20 goes beyond the edge of the encapsulating structure 100, and the cathode layer 70 can be overlapped with the second electrode metal layer 30 at the position at which the first electrode metal layer 20 does not go beyond the edge of the encapsulating structure 100, specifically the cathode layer 70 can be overlapped with the second electrode metal layer 30 through a material layer which is in the same layer as the anode. For example, the display panel includes four border areas which encircle the display area, where the first electrode metal layer 20 in the first border area goes beyond the edge of the encapsulating structure 100, and the first electrode metal layer 20 in the remaining three border areas does not go beyond the edge of the encapsulating structure 100, further, the cathode layer 70 can be overlapped with the second electrode metal layer 30 in the three border areas, and no overlapping occurs in the first border area, thereby effectively preventing external water vapor from entering a display area of the display panel along the reference power line and the anode material layer, improving the encapsulating effect, and improving the performance of the display panel.

In one possible implementation, an organic insulating layer 80 can further be arranged between the pixel definition layer 60 and the second electrode metal layer 30, optionally, on a side, close to the encapsulating structure, of the second electrode metal layer 30, the organic insulating layer 80 completely covers the second electrode metal layer 30, to protect the second electrode metal layer 30. Specifically, the organic insulating layer 80 can play a role of flattening, and the material of the organic insulating layer 80 can be a possible material which is the same as that of a flattening layer of the display area, so as to be reused with the film layer of the display area, and save the manufacturing process.

Further, on a side, close to the edge of the encapsulating structure 100, of the second electrode metal layer 30, the blocking dam 50 completely covers the organic insulating layer 80, to prevent external water vapor from permeating into the organic insulating layer 80 and the second electrode metal layer 30.

Specifically, the complete cover in the present application means not only covering an upper surface of a shielding film layer, but also covering a side surface of the shielding film layer.

Based on the same application idea, an embodiment of the present application further provides a display device which includes any of the above display panels provided in the embodiments of the present application. The display device can be any product or part with a display function, such as a mobile phone, a tablet personal computer, a television, a display, a notebook computer, a digital photo frame, and a navigator. For the implementation of the display device, please refer to the above embodiments of the display panel, and the repeated parts will not be repeated redundantly herein.

Evidently those skilled in the art can make various modifications and variations to the present application without departing from the spirit and scope of the present application. Thus the present application is also intended to encompass these modifications and variations thereto so long as the modifications and variations made to the present application come into the scope of the claims appended to the present application and their equivalents.

The invention claimed is:

1. A display panel, comprising:
  a base substrate;
  a reference power line, arranged in a non-display area and comprising a first electrode metal layer and a second electrode metal layer which are arranged on the base substrate in sequence in a stacked manner; and
  an encapsulating structure, arranged on a side, deviating from the base substrate, of the reference power line;

wherein in the reference power line, a projection of the second electrode metal layer on the base substrate is arranged within a projection of the encapsulating structure on the base substrate, and a projection of the first electrode metal layer on the base substrate goes beyond an edge of the projection of the encapsulating structure on the base substrate;

wherein the display panel further comprises:
an inorganic insulating layer arranged between the first electrode metal layer and the second electrode metal layer, wherein the inorganic insulating layer completely covers a part of the first electrode metal layer going beyond an edge of the encapsulating structure;

wherein the inorganic insulating layer is provided with an opening, the first electrode metal layer comprises a first part and a second part, and the second electrode metal layer is in contact with the first part of the first electrode metal layer at the opening in a stacked manner.

2. The display panel of claim 1, wherein a material of the inorganic insulating layer comprises silicon oxide or silicon nitride.

3. The display panel of claim 1, further comprising:
a blocking dam arranged between the second electrode metal layer and the encapsulating structure, wherein the blocking dam covers on a side, close to an edge of the encapsulating structure, of the second electrode metal layer.

4. The display panel of claim 3, further comprising:
a pixel definition layer arranged between the second electrode metal layer and the encapsulating structure; wherein the pixel definition layer and the blocking dam belong to a same film layer.

5. The display panel of claim 4, further comprising:
an organic insulating layer arranged between the pixel definition layer and the second electrode metal layer.

6. The display panel of claim 5, wherein on the side, close to the edge of the encapsulating structure, of the second electrode metal layer, the organic insulating layer completely covers the second electrode metal layer.

7. The display panel of claim 6, wherein on the side, close to the edge of the encapsulating structure, of the second electrode metal layer, the blocking dam completely covers the organic insulating layer.

8. The display panel of claim 7, further comprising a cathode layer arranged on a side, far away from the second electrode metal layer, of the pixel definition layer;
part of the first electrode metal layer goes beyond the edge of the encapsulating structure, and at the position at which the first electrode metal layer does not go beyond the edge of the encapsulating structure, the cathode layer is electrically connected with the second electrode metal layer.

9. The display panel of claim 1, wherein the first electrode metal layer and the second electrode metal layer are titanium/aluminum/titanium metal composite film layers.

10. A display device, comprising a display panel, wherein the display panel comprises:
a base substrate;
a reference power line, arranged in a non-display area and comprising a first electrode metal layer and a second electrode metal layer which are arranged on the base substrate in sequence in a stacked manner; and
an encapsulating structure, arranged on a side, deviating from the base substrate, of the reference power line;

wherein in the reference power line, a projection of the second electrode metal layer on the base substrate is arranged within a projection of the encapsulating structure on the base substrate, and a projection of the first electrode metal layer on the base substrate goes beyond an edge of the projection of the encapsulating structure on the base substrate;

wherein the display panel further comprises:
an inorganic insulating layer arranged between the first electrode metal layer and the second electrode metal layer, wherein the inorganic insulating layer completely covers a part of the first electrode metal layer going beyond an edge of the encapsulating structure;

wherein the inorganic insulating layer is provided with an opening, the first electrode metal layer comprises a first part and a second part, and the second electrode metal layer is in contact with the first part of the first electrode metal layer at the opening in a stacked manner.

11. The display device of claim 10, wherein a material of the inorganic insulating layer comprises silicon oxide or silicon nitride.

12. The display device of claim 10, wherein the display panel further comprises:
a blocking dam arranged between the second electrode metal layer and the encapsulating structure, wherein the blocking dam covers on a side, close to an edge of the encapsulating structure, of the second electrode metal layer.

13. The display device of claim 12, wherein the display panel further comprises:
a pixel definition layer arranged between the second electrode metal layer and the encapsulating structure; wherein the pixel definition layer and the blocking dam belong to a same film layer.

14. The display device of claim 13, wherein the display panel further comprises:
an organic insulating layer arranged between the pixel definition layer and the second electrode metal layer.

15. The display device of claim 14, wherein on the side, close to the edge of the encapsulating structure, of the second electrode metal layer, the organic insulating layer completely covers the second electrode metal layer.

16. The display device of claim 15, wherein on the side, close to the edge of the encapsulating structure, of the second electrode metal layer, the blocking dam completely covers the organic insulating layer.

17. The display device of claim 16, wherein the display panel further comprises:
a cathode layer arranged on a side, far away from the second electrode metal layer, of the pixel definition layer;
part of the first electrode metal layer goes beyond the edge of the encapsulating structure, and at the position at which the first electrode metal layer does not go beyond the edge of the encapsulating structure, the cathode layer is electrically connected with the second electrode metal layer.

18. The display device of claim 10, wherein the first electrode metal layer and the second electrode metal layer are titanium/aluminum/titanium metal composite film layers.

* * * * *